(12) United States Patent  Zhu

(10) Patent No.: US 9,704,715 B2
(45) Date of Patent: Jul. 11, 2017

(54) METHOD FOR MANUFACTURING SEMICONDUCTOR DEVICE

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

(*) Notice: Subject to any disclaimer, the term of this patent is extended or adjusted under 35 U.S.C. 154(b) by 176 days.

(21) Appl. No.: 14/406,735

(22) PCT Filed: Oct. 29, 2013

(86) PCT No.: PCT/CN2013/086119
§ 371 (c)(1),
(2) Date: Dec. 9, 2014

(87) PCT Pub. No.: WO2015/035690
PCT Pub. Date: Mar. 19, 2015

(65) Prior Publication Data
US 2016/0268138 A1    Sep. 15, 2016

(30) Foreign Application Priority Data
Sep. 13, 2013  (CN) .......................... 2013 1 0418179

(51) Int. Cl.
*H01L 21/027* (2006.01)
*H01L 29/66* (2006.01)
(Continued)

(52) U.S. Cl.
CPC .... *H01L 21/28123* (2013.01); *H01L 21/0271* (2013.01); *H01L 21/28035* (2013.01);
(Continued)

(58) Field of Classification Search
CPC ....................... H01L 21/28123; H01L 29/6656
See application file for complete search history.

(56) References Cited

U.S. PATENT DOCUMENTS 5,874,328 A * 2/1999 Liu ................. H01L 21/823878
257/E21.551
2007/0178388 A1 * 8/2007 Lipinski ............ H01L 21/28123
430/5
(Continued)

FOREIGN PATENT DOCUMENTS

CN         1996600 A     7/2007
CN       101950735 A     1/2011

*Primary Examiner* — Moazzam Hossain
(74) *Attorney, Agent, or Firm* — Christensen, Fonder, Dardi & Herbert PLLC

(57) ABSTRACT

A method for manufacturing a semiconductor device is provided. The method may include: forming a first material layer and a second material layer on a substrate; forming an auxiliary layer on the second material layer; forming, in the auxiliary layer, openings corresponding to gate structures to be formed; forming a third material layer to cover the auxiliary layer; forming, on the third material layer, a mask layer corresponding to at least one of the gate structures; patterning the third material layer to remove its lateral extending portions, with the mask layer present thereon; removing the auxiliary layer; patterning the second material layer with the patterned third material layer a mask, such that the gate structures, for which different gate lengths can be defined, are formed.

14 Claims, 5 Drawing Sheets

(51) Int. Cl.
  *H01L 21/28* (2006.01)
  *H01L 21/762* (2006.01)
  *H01L 21/768* (2006.01)
  *H01L 21/8238* (2006.01)
  *H01L 29/78* (2006.01)

(52) U.S. Cl.
  CPC .. *H01L 21/76802* (2013.01); *H01L 21/82385* (2013.01); *H01L 29/6656* (2013.01); *H01L 29/7833* (2013.01); *H01L 21/762* (2013.01); *H01L 29/6659* (2013.01)

(56) References Cited

U.S. PATENT DOCUMENTS

| | | |
|---|---|---|
| 2008/0164526 A1 | 7/2008 | Wang et al. |
| 2009/0096010 A1* | 4/2009 | Hyun .................... H01L 27/105 257/321 |
| 2009/0261337 A1* | 10/2009 | Sakakura ................ H01L 27/12 257/72 |
| 2009/0261423 A1* | 10/2009 | Sawada ................ H01L 29/785 257/392 |
| 2010/0248481 A1* | 9/2010 | Schultz ............... G06F 17/5068 438/694 |
| 2012/0171833 A1* | 7/2012 | Zhu .................... H01L 29/66795 438/303 |
| 2012/0280318 A1* | 11/2012 | Zhang ................ H01L 27/0922 257/335 |
| 2014/0015029 A1* | 1/2014 | Hsu .................... H01L 21/28273 257/316 |
| 2014/0061737 A1* | 3/2014 | Hsu .................... H01L 27/1463 257/290 |
| 2014/0329380 A1* | 11/2014 | Cheng ............... H01L 21/28008 438/587 |
| 2016/0284602 A1* | 9/2016 | Cai .................... H01L 21/82387 438/694 |
| 2016/0293776 A1* | 10/2016 | Amo .................... H01L 29/792 257/392 |

* cited by examiner

METHOD FOR MANUFACTURING SEMICONDUCTOR DEVICE

CROSS-REFERENCE TO RELATED APPLICATION(S)

This application is a U.S. national phase application of PCT Application No. PCT/CN2013/086119, entitled "METHOD FOR MANUFACTURING SEMICONDUCTOR DEVICE," filed on Oct. 29, 2013, which claims priority to Chinese Application No. 201310418179.8 filed on Sep. 13, 2013. Both the PCT Application and the Chinese Application are incorporated herein by reference in their entirety.

FIELD OF THE INVENTION

The present disclosure generally relates to the field of semiconductor manufacture, and in particular, to a method for manufacturing a semiconductor device, by which it is possible to improve LER and adjust a gate length.

BACKGROUND OF THE INVENTION

With continued scaling down of devices, various challenges arise in device manufacture. For example, when the gate length is smaller than, for example, 20 nm, a gate is very difficult to be formed. Furthermore, in this case, it is extremely difficult to control Line Edge Roughness (LER) of the gate.

It is known that the LER may be improved by Spacer Transfer Image (STI) technology. However, it is difficult for STI technology to create gate structures with different gate lengths simultaneously, thereby its application is limited or the manufacturing cost is increased.

SUMMARY

The present disclosure aims to provide, among others, a method for manufacturing a semiconductor device.

According to an aspect of the present disclosure, a method for manufacturing a semiconductor device is provided. The method may comprise: forming a first material layer and a second material layer on a substrate; forming an auxiliary layer on the second material layer; forming, in the auxiliary layer, openings corresponding to gate structures to be formed; forming a third material layer to cover the auxiliary layer; forming, on the third material layer, a mask layer corresponding to at least one of the gate structures; patterning the third material layer to remove its lateral extending portions, with the mask layer present thereon; removing the auxiliary layer; patterning the second material layer with the patterned third material layer as a mask, such that the gate structures, for which different gate lengths can be defined, are formed.

According to embodiments of the present disclosure, the gate structures are formed in accordance with STI technology, and the photolithography technology is used as a supplement for the STI technology. In this way, it is possible to improve LER and achieve relatively short gate lengths by STI technology, which otherwise would be hardly achieved by photolithography technology, and also to achieve convenient adjustment of the gate lengths.

BRIEF DESCRIPTION OF THE DRAWINGS

The above, and other objects, features, and advantages of the present disclosure will become more apparent from the following descriptions of embodiments thereof with reference to attached drawings, in which.

DETAILED DESCRIPTION

Figure 1:
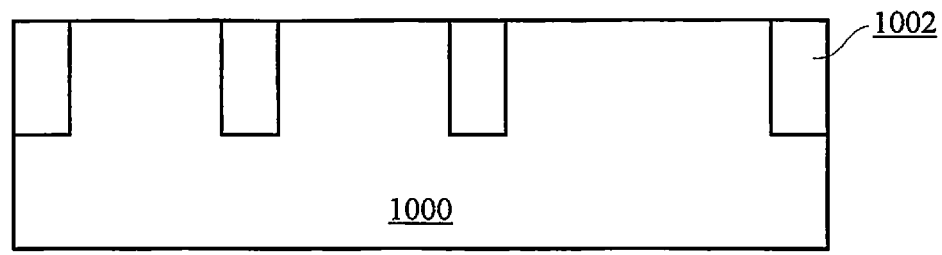
FIGS. 1-10 are views schematically showing some stages in a flow for manufacturing a semiconductor device according to an embodiment of the present disclosure.

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacturing tolerances and technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

According to an embodiment of the present disclosure, a method for manufacturing a semiconductor device is provided. The method may comprise forming gate structures according to STI technology. For example, a stack of a first material layer and a second material layer may be formed on a substrate. The first material layer may comprise a gate dielectric layer or a sacrificial gate dielectric layer, and the second material layer may comprise a gate conductor layer or a sacrificial gate conductor layer. To perform pattern transfer, an auxiliary layer may be formed on this stack, and openings corresponding to the gate structures may be formed therein. Here, the so-called "gate structures" may refer to one or more layers in finally formed gate stacks or the gate stacks themself; the so-called "corresponding to the gate structures" may comprise various corresponding relationships. For example, locations of the respective openings themselves may correspond to those of the respective gate structures, or one or more side walls of the respective openings may substantially correspond to lateral boundary or boundaries of the respective gate structures. This will become more apparent from the descriptions below.

Next, a third material layer may be formed to cover the auxiliary layer. For example, the third material layer may be deposited in a substantially conformal way. This third material layer may comprise vertical extending portions extending on the side walls of the openings and lateral extending portions extending on a top surface of the stack. Then, the lateral extending portions of the third material layer may be removed by patterning the third material layer. Such patterning may be achieved, for example, by a spacer formation process.

In this way, after the auxiliary layer is removed, the patterned third material layer may form masks for the gate structures. Because side walls of these masks are defined by the openings of the auxiliary layer, rather than by etching, the side walls may be relatively smooth. Therefore, LER-improved gate structures may be obtained by patterning the stack with aid of these masks.

According to an embodiment of the present disclosure, to adjust the lengths of the gate structures (or, "gate lengths") efficiently, a mask layer corresponding to at least one of the gate structures may be formed on the third material layer before patterning the third material layer. The mask layer may cover at least a part of the lateral extending portions of the third material layer. In this way, it is possible to prevent this part of the lateral extending portions covered by the mask layer from being removed during patterning of the third material layer, and is thus preserved (and acts as a mask for the gate structure).

In order to preserve advantages of STI technology, the preserved part of the lateral extending portions has at least one end surface thereof terminated at the vertical extending portion(s). For example, the mask layer may cover the lateral extending portion on the bottom wall of the corresponding opening, with one or two of its ends not exceeding lateral boundary or boundaries of this opening. For example, the one or two ends may be recessed towards the inside of the opening with respect to the respective side walls of the opening. In this way, after the third material layer is patterned, a lateral extent of the preserved part of the third material layer left in this opening (which constitutes a mask for the corresponding gate structure) corresponds to that of this opening, and therefore defines the gate length of the corresponding gate structure. Furthermore, this mask has one or two of its side surfaces defined by the opening, resulting in improved LER as described above.

The technology of the present disclosure can be implemented in various ways, some of which are exemplified in the following with reference to the drawings.

As shown in FIG. 1, a substrate 1000 is provided. The substrate 1000 may comprise any suitable form of substrate, for example, a bulk semiconductor substrate such as Si, Ge, or the like, a compound semiconductor substrate such as SiGe, GaAs, GaSb, AlAs, InAs, InP, GaN, SiC, InGaAs, InSb, InGaSb, or the like, or a Semiconductor on Insulator (SOI) substrate. Here, an example of a bulk silicon substrate and silicon-based materials are described. However, it is to be noted that the present disclosure is not limited thereto. On the substrate 1000, shallow trench isolations 1002 may be formed to define active regions. The shallow trench isolation 1002 may comprise oxide (for example, silicon oxide).

Figure 2:
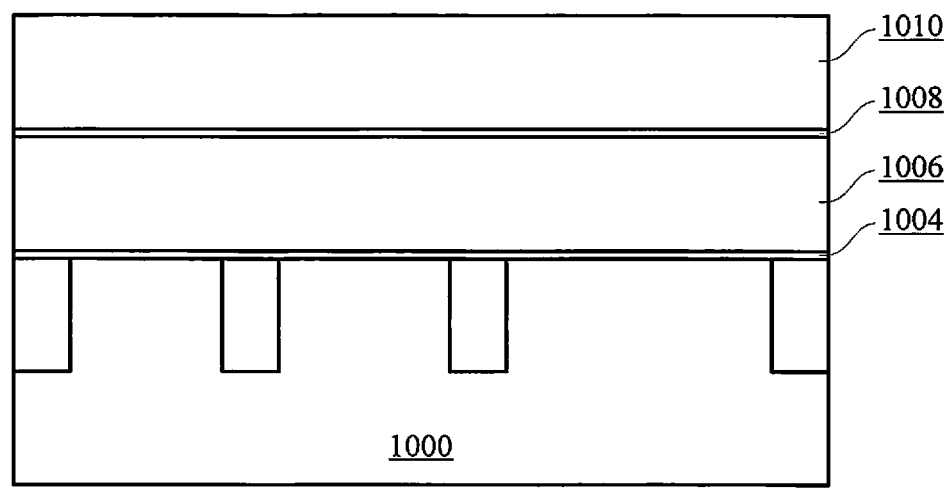

As shown in FIG. 2, on the substrate 1000, a gate dielectric layer 1004 and a gate conductor layer 1006 may be formed in turn, for example, by deposition. The gate dielectric layer 1004 may comprise oxide (for example, $SiO_2$) with a thickness of about 1-5 nm; the gate conductor layer 1006 may comprise poly silicon with a thickness of about 50-150 nm. On top of a stack of the gate dielectric layer 1004 and the gate conductor layer 1006, an auxiliary layer 1010 may be formed, for example, by deposition. The auxiliary layer 1010 may comprise amorphous silicon with a thickness of about 100-150 nm. To improve etching selectivity and protect the gate conductor layer, a stop layer 1008 may be formed on a top surface of the gate conductor layer. In this case, the auxiliary layer 1010 may be formed on top of the stop layer 1008. The stop layer 1008 may comprise oxide with a thickness of about 1-10 nm.

Figure 3:
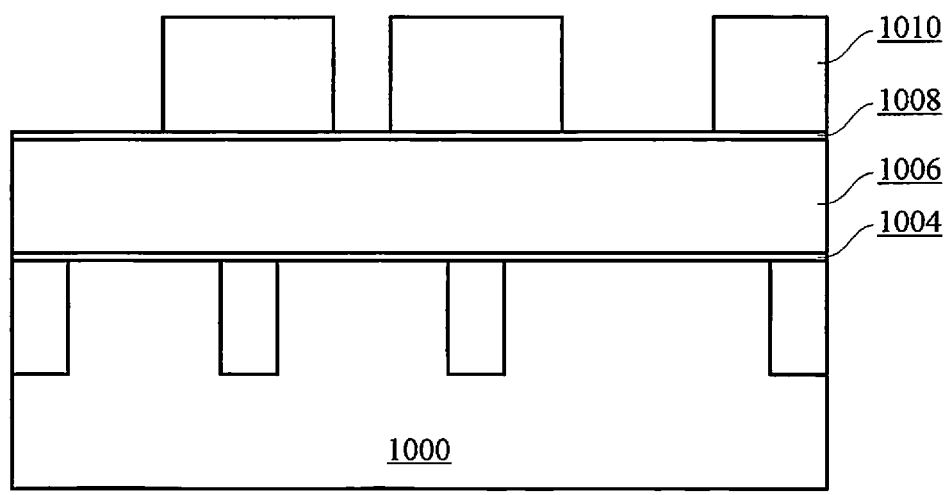

Next, as shown in FIG. 3, the auxiliary layer 1010 may be patterned by photolithography to form openings therein. These openings correspond to gate structures to be formed later. In FIG. 3, three openings (corresponding to three gate structures) are defined in three active regions (each defined by the shallow trench isolations on both sides), respectively. It is to be noted that in the example of FIG. 3 only one side wall is shown for the leftmost opening. This may be because this opening is located at the peripheral edge and thus has only this one side wall, or because another side wall is present but on a portion outside the leftmost shallow trench isolation 1002 (not shown and corresponding to another active region).

Figure 4:
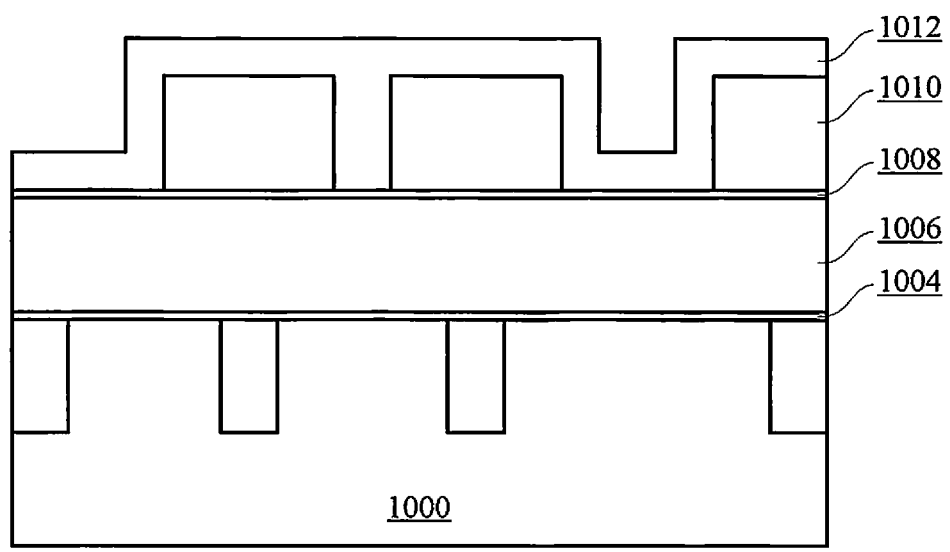

Subsequently, as shown in FIG. 4, a material layer 1012 may be formed on the structure as shown in FIG. 3, for example, by deposition. The material layer 1012 may be deposited in a substantially conformal way. Here, the so called "in a substantially conformal way" refers to that the degree of conformality (a ratio of a thickness grown on a vertical surface to a thickness grown on a horizontal surface) is substantially 1 (one), possibly with variations in an acceptable range (for example, about 1.0-0.7). This material layer 1012 may comprise nitride (for example, silicon nitride), with a deposition thickness (here, it particularly refers to a thickness on side walls of the openings; in a case where the degree of conformality is 1, the deposition thickness may refer to a film thickness of the deposited material layer 1012) which can be used to define the minimal gate length $L_{min}$ of the gate structures to be formed, for example, about 5-25 nm.

The material layer 1012 may comprise vertical extending portions extending on vertical surfaces (here, the side walls of the openings) and horizontal extending portions extending on horizontal surfaces (here, a top surface of the stop layer). In the example of FIG. 4, the middle opening has two side walls (in the corresponding active region), with a lateral size defined by the two side walls (size in a horizontal direction in the figure, also referred to as "width" hereinafter) smaller than twice the thickness of the material layer. Therefore, portions of the material layer 1012 grown on the opposite sides may converge with each other such that this opening is substantially filled up. The rightmost opening has two side walls (in the corresponding active region), with a width defined by the two side walls greater than twice the thickness of the material layer, such that the material layer 1012 may extend on the bottom wall and the opposite side walls of this opening. With regard to the leftmost opening, as described above, it may be located at the edge and comprise only the single side wall, and therefore it may be regarded as having no width limitation; or it may comprise another side wall (for example, in another active region) apart from the shown side wall by a great distance (for example, greater than twice the thickness of the material layer). Therefore, the material layer 1012 may extend on the sidewall(s) and the bottom wall of this opening.

Figure 5:
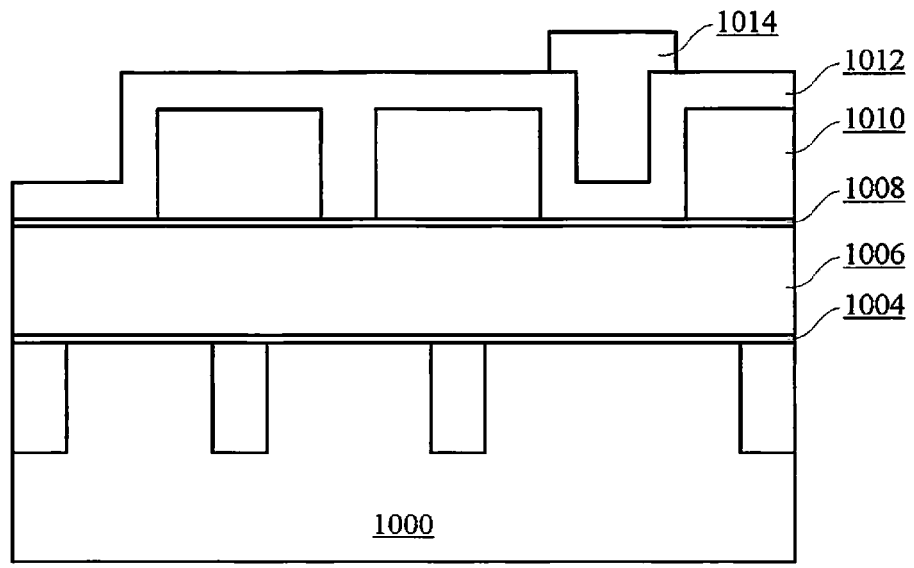

Next, as shown in FIG. 5, a mask layer 1014 corresponding to at least one of the gate structures may be formed on the material layer. The mask layer 1014 may comprise photoresist. In this example, the mask layer 1014 is formed at the rightmost opening. This mask layer 1014 may cover at least the lateral extending portion of the material layer (on the bottom wall of this opening) in this opening, and may further extend onto the vertical extending portions of the material layer (on the side walls of this opening) in this opening. As described above, at least one end of the mask layer 1014 (in this example, two ends) may be recessed towards the inside of the opening with respect to the respective side walls of the opening.

Figure 6:
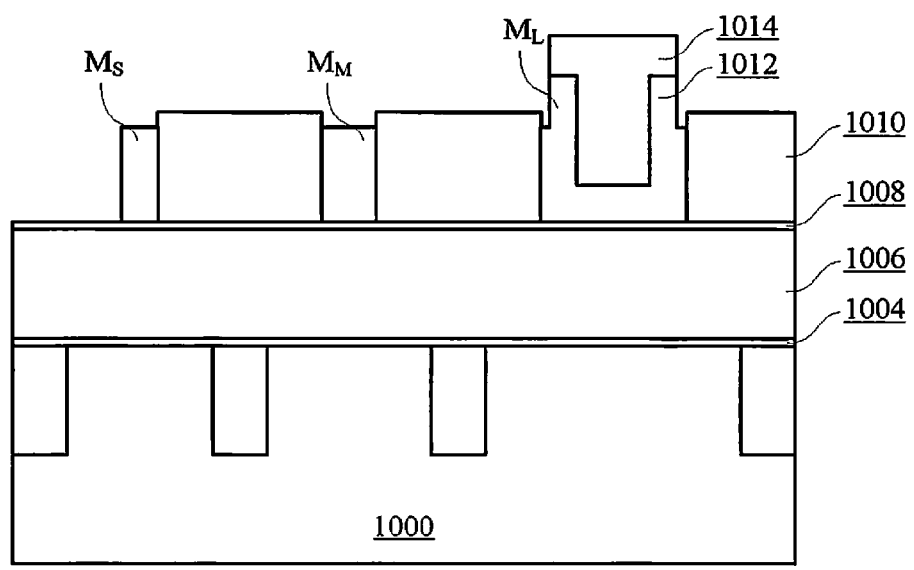

Subsequently, as shown in FIG. 6, the material layer may be patterned to remove its lateral extending portions. Such patterning may be performed, for example, according to a spacer formation process. In particular, Reactive Ion Etching (RIE) may be performed on the material layer 1012, for example, at a substantially vertical angle. In this way, the vertical extending portions on the vertical surfaces (the side walls of the openings) may be preserved (resulting in "spacers"). Due to the presence of the mask layer 1014, in the rightmost opening, not only the spacers, but also the lateral extending portion is preserved. It is known for one skilled in the art to perform such a spacer formation process in various manners, and thus detailed descriptions thereon will be omitted here for simplicity.

As a result, the patterned material layer 1012 forms masks $M_S$, $M_M$, and $M_L$ for the gate structures. In the leftmost opening, the mask $M_S$ has a width substantially corresponding to the deposition thickness of the material layer 1012; in the middle opening, the mask $M_M$ has a width substantially corresponding to the width of this opening; and in the rightmost opening, the mask $M_L$ has a width substantially corresponding to the width of this opening.

Figure 8:
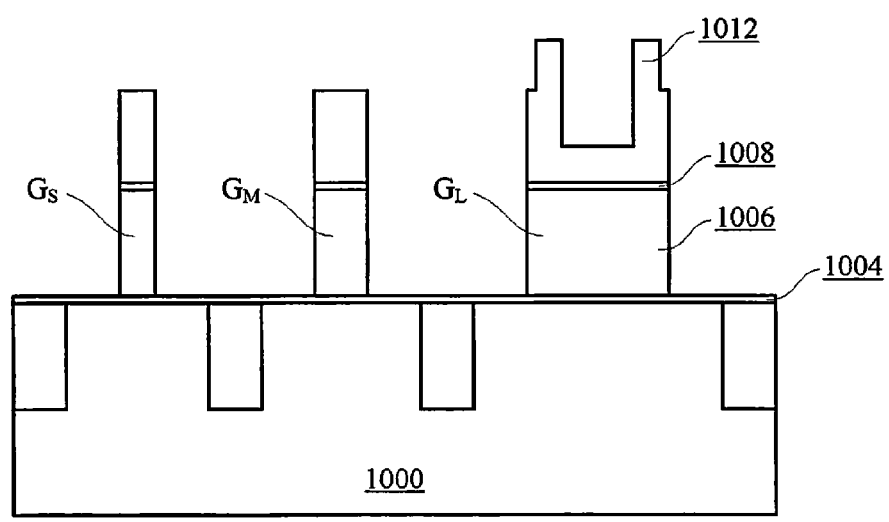

More can be further seen from FIG. 6 (in conjunction with FIG. 8). Specifically, for a relatively small gate structure (for example, one with the minimal gate length $L_{min}$), a relatively large opening may be formed to have a single side wall (in the corresponding active region) (i.e., the opening may have no other side wall, for example, because it is disposed at the edge; or the opening may have another side wall disposed in another active region). This side wall substantially defines a lateral boundary of the gate structure. For a medium sized gate structure (for example, one with the gate length between $L_{min}$ and $2L_{min}$) and a relatively large gate structure (for example, one with the gate length greater than $2L_{min}$), an opening corresponding to this gate structure may be formed (in the corresponding active region). The sidewalls of this opening substantially define lateral boundaries of the gate structure. Furthermore, a mask layer may be formed for the relatively large gate structure (for example, one with the gate length greater than $2L_{min}$). Therefore, it is possible to adjust the gate structure in size by changing the width of the opening.

Figure 7:
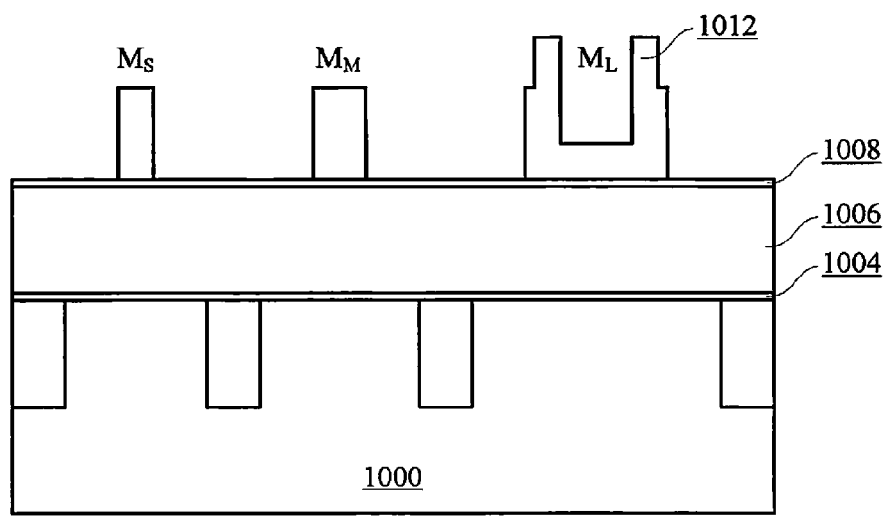

After that, as illustrated in FIG. 7, the auxiliary layer 1010 may be removed by selective etching with respect to the stop layer 1008. It can be seen that side walls of the masks $M_S$, $M_M$, and $M_L$ can be relatively smooth because they undergo substantially no etching, resulting in improved LER.

Next, as shown in FIG. 8, the stop layer 1008 and the gate conductor layer 1006 may be selectively etched sequentially by, e.g., RIE, with the aid of the masks $M_S$, $M_M$, and $M_L$, to obtain corresponding gate structures GS, GM, and GL. Here, optionally, the gate dielectric layer 1004 may be also selectively etched by, e.g., RIE.

Figure 9:
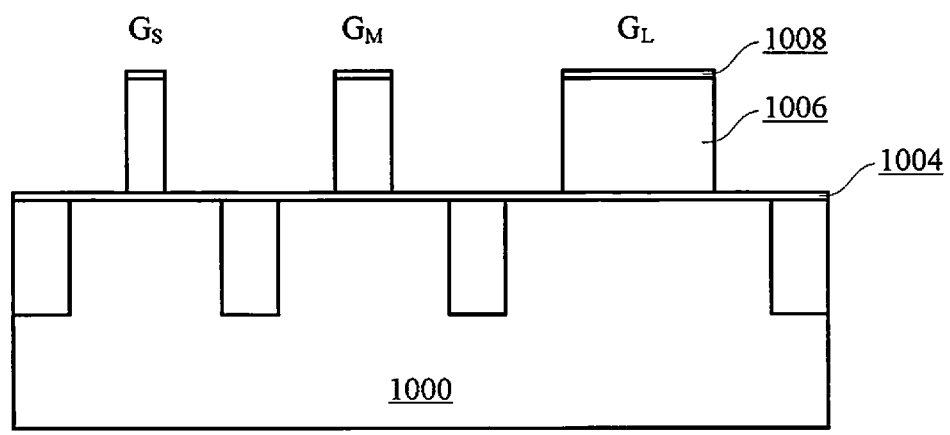

Subsequently, as shown in FIG. 9, the masks $M_S$, $M_M$, and $M_L$ may be selectively removed. In a case where the gate dielectric layer 1004 is not etched in the operations described above with reference to FIG. 8, the stop layer 1008 and the gate dielectric layer 1004 (in this example, both are oxide) may be selectively etched by, e.g., RIE. Due to the presence of the gate structures $G_S$, $G_M$, and $G_L$, the gate dielectric layer 1004 may be left under the gate structures $G_S$, $G_M$, and $G_L$ (here, a stack of the patterned gate dielectric layer and the patterned gate conductor is referred to as a gate stack).

After the gate stacks are formed, devices may be manufactured in various manners. For example, halo and extension implantation may be performed with the respective gate stacks as a mask. After that, spacers 1016 may be formed on side walls of the respective gate stacks. For example, the spacers 1016 may be formed by conformally depositing a layer of nitride and performing selective etching, for example, RIE, on this layer of nitride. Next, source/drain implantation may be performed with the respective gate stacks and the respective spacers 1016 as a mask. Annealing may be performed to activate implanted ions to form source/drain regions (as shown by dashed lines in the figure).

Figure 10:
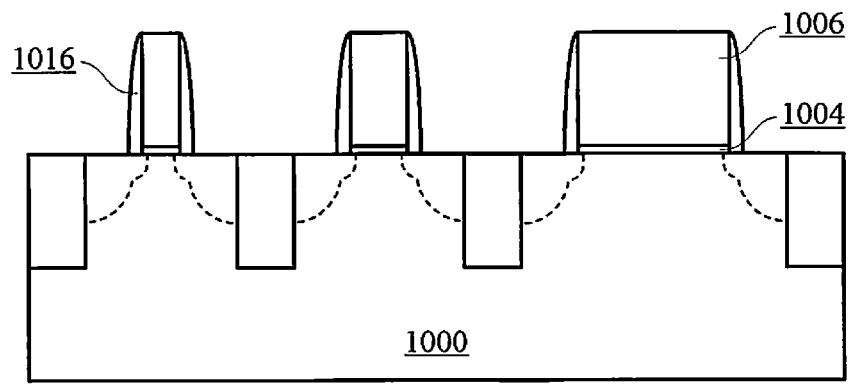

The gate-first process is described above. However, the present disclosure is not limited thereto. The gate-last process is also applicable. For example, the above formed gate dielectric layer and gate conductor layer may be a sacrificial gate dielectric layer and a sacrificial gate conductor layer (resulting in sacrificial gate stacks after the patterning), respectively. In this case, an inter-layer dielectric layer (not shown) may be formed on the structure of FIG. 10, and then planarized. The planarization may use the spacers 1016 as an end point to expose the sacrificial gate stacks. The sacrificial gate stacks (in particular, the sacrificial gate conductor layer 1006 and the sacrificial gate dielectric layer 1004) may be removed by selective etching, for example, wet etching. In this way, gate trenches are left at the inner side of the spacers 1016 in the inter-layer dielectric layer. After that, true gate stacks may be formed in the gate trenches. A high-K gate dielectric layer and a metal work function layer (not shown) may be formed in turn by, e.g., deposition. For example, the high-K gate dielectric layer may comprise $HfO_2$ or the like; the metal work function layer 1010 may comprise TiAl, TiN, or the like. The metal work function layer may comprise a single layer configuration or a stack configuration.

In the above embodiments, a situation where three gate structures or gate stacks are formed is described. However, the present disclosure is not limited thereto. For example, more or less gate structures or gate stacks may be formed.

Furthermore, in the above embodiments, in each individual active region defined by the shallow trench isolation, a single gate structure or gate stack is formed separately. However, the present disclosure is not limited thereto. For example, more gate structures or gate stacks may be formed in an individual active region. For example, an opening similar to the rightmost opening in the above examples may be formed in a certain active region, and no mask layer is formed on the material layer after the material layer is formed. In this way, after the patterning, two spacers may be left on opposite side walls of this opening. The two spacers may be used as a mask to obtain two gate structures or gate stacks in this active region.

Furthermore, in the above embodiments, planar devices are described. However, the present disclosure is not limited thereto. The present disclosure is also applicable to non-planar devices, for example, FinFETs.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not mean that means recited in the respective embodiments cannot be used in combination to advantage.

From the foregoing, it will be appreciated that specific embodiments of the disclosure have been described herein for purposes of illustration, but that various modifications may be made without deviating from the disclosure. Further, many of the elements of one embodiment may be combined with other embodiments further to or in lieu of the elements of the other embodiments. Accordingly, the technology is not limited except as by the appended claims.

I claim:

1. A method for manufacturing a semiconductor device, comprising:
   forming a first material layer and a second material layer on a substrate, wherein the second material layer is provided for forming gate structures;
   forming an auxiliary layer on the second material layer;
   forming, in the auxiliary layer, openings corresponding to the gate structures to be formed, wherein at least some of the openings have different lateral sizes from each other, and wherein said different lateral sizes correspond to different gate lengths of the gate structures to be formed;
   forming a third material layer to cover the auxiliary layer, the third material layer having a thickness on top of the auxiliary layer less than a half of a width of the opening corresponding to the at least one gate structure;
   forming, on the third material layer, a mask layer corresponding to at least one of the gate structures, wherein the mask layer has its boundaries recessed inwards with respect to boundaries of the opening corresponding to the at least one gate structure;
   patterning the third material layer to remove its laterally extending portions, with the mask layer present thereon;
   removing the auxiliary layer;
   patterning the second material layer with the patterned third material layer as a mask, such that the gate structures having said different gate lengths are formed.

2. The method according to claim 1, wherein the third material layer has a deposition thickness which defines a minimal gate length for said different gate lengths.

3. The method according to claim 2, wherein the minimal gate length is 5 nm-25 nm.

4. The method according to claim 1, wherein the first material layer comprises a gate dielectric layer and the second material layer comprises a gate conductor layer.

5. The method according to claim 1, wherein the first material layer comprises a sacrificial gate dielectric layer and the second material layer comprises a sacrificial gate conductor layer.

6. The method according to claim 1, wherein the openings comprise a first opening, with a lateral size greater than twice a thickness of the third material layer, such that a spacer is formed on a side wall of the first opening from the third material layer after being patterned, wherein the spacer defines one of the gate structures.

7. The method according to claim 1, wherein the openings comprise a second opening, with a lateral size smaller than twice a thickness of the third material layer and corresponding to the gate length of one of the gate structures, such that the third material layer substantially fills up the opening.

8. The method according to claim 1, wherein the openings comprises a third opening, with a lateral size greater than twice a thickness of the third material layer and corresponding to the gate length of one of the gate structures, and wherein the mask layer covers at least a laterally extending portion of the third material layer in the third opening without extending beyond a lateral boundary of the third opening.

9. The method according to claim 1, wherein the third material layer is deposited in a substantially conformal manner.

10. The method according to claim 1, wherein patterning the third material layer comprises patterning in a spacer formation process.

11. The method according to claim 4, further comprising forming a stop layer on the gate conductor layer, wherein the auxiliary layer is formed on this stop layer.

12. The method according to claim 11, wherein the gate dielectric layer comprises oxide, the gate conductor layer comprises poly silicon, the stop layer comprises oxide, the auxiliary layer comprises amorphous silicon, and the third material layer comprises nitride.

13. The method according to claim 1, wherein the first material layer has a substantially uniform first thickness, the second material layer has a substantially uniform second thickness, and the auxiliary layer has a substantially uniform third thickness.

14. The method according to claim 13, wherein forming the auxiliary layer comprises:
   forming the auxiliary layer having a flat top surface substantially parallel to a surface of the substrate.

* * * * *